(12) United States Patent
Fukushima et al.

(10) Patent No.: US 7,829,400 B2
(45) Date of Patent: Nov. 9, 2010

(54) SEMICONDUCTOR DEVICE FABRICATION METHOD AND SEMICONDUCTOR DEVICE

(75) Inventors: Yasumori Fukushima, Nara (JP); Yutaka Takafuji, Nara (JP); Masao Moriguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 587 days.

(21) Appl. No.: 11/792,487

(22) PCT Filed: Nov. 15, 2005

(86) PCT No.: PCT/JP2005/020945

§ 371 (c)(1),
(2), (4) Date: Jun. 7, 2007

(87) PCT Pub. No.: WO2006/075444

PCT Pub. Date: Jul. 20, 2006

(65) Prior Publication Data

US 2008/0128807 A1 Jun. 5, 2008

(30) Foreign Application Priority Data

Jan. 12, 2005 (JP) ............................. 2005-005300

(51) Int. Cl.
*H01L 21/8234* (2006.01)
(52) U.S. Cl. ............... 438/197; 438/458; 257/E21.675; 257/638; 257/E29.133
(58) Field of Classification Search ................. 438/197, 438/458; 257/E21.675, 638, E29.133, E21.568, 257/E21.57
See application file for complete search history.

(56) References Cited

U.S. PATENT DOCUMENTS 3,865,654 A * 2/1975 Chang et al. ................. 438/216

(Continued)

FOREIGN PATENT DOCUMENTS

JP 11-186186 7/1999

(Continued)

OTHER PUBLICATIONS

International Search Report mailed Feb. 21, 2006 (English and Japanese Text).

(Continued)

*Primary Examiner*—Fernando L Toledo
*Assistant Examiner*—Ankush K Singal
(74) *Attorney, Agent, or Firm*—Nixon & Vanderhye P.C.

(57) ABSTRACT

In fabricating a semiconductor device, an element forming surface formation step of forming a plurality of element forming surfaces of different heights on a semiconductor layer to have different levels, a semiconductor element formation step of forming a plurality of semiconductor elements and, one in each of a corresponding number of regions of the semiconductor layer, each region including an associated one of the plurality of element forming surfaces, a level-difference compensation insulating film formation step of forming a level-difference compensation insulating film on the semiconductor layer to cover the semiconductor elements and have a surface with different levels along the element forming surfaces, a release layer formation step of forming a release layer in the semiconductor layer by ion-implanting a peeling material through the level-difference compensation insulating film into the semiconductor layer, and a separation step of separating part of the semiconductor layer along the release layer are performed.

15 Claims, 16 Drawing Sheets

U.S. PATENT DOCUMENTS

| | | | | |
|---|---|---|---|---|
| 4,466,174 A * | 8/1984 | Darley et al. | ............... | 438/178 |
| 4,516,316 A * | 5/1985 | Haskell | ...................... | 438/420 |
| 4,708,770 A * | 11/1987 | Pasch | ...................... | 438/453 |
| 4,728,619 A * | 3/1988 | Pfiester et al. | ............. | 438/451 |
| 4,743,563 A * | 5/1988 | Pfiester et al. | ............. | 438/440 |
| 4,777,147 A * | 10/1988 | Scott et al. | ................. | 438/153 |
| 4,929,565 A * | 5/1990 | Parrillo | .................... | 438/443 |
| 4,983,537 A * | 1/1991 | Wei | ........................... | 438/425 |
| 5,019,526 A * | 5/1991 | Yamane et al. | ............ | 438/440 |
| 5,024,961 A * | 6/1991 | Lee et al. | ................... | 438/443 |
| 5,100,830 A * | 3/1992 | Morita | ...................... | 438/297 |
| 5,134,085 A * | 7/1992 | Gilgen et al. | .............. | 438/210 |
| 5,242,844 A * | 9/1993 | Hayashi | .................... | 438/151 |
| 5,298,782 A * | 3/1994 | Sundaresan | ................. | 257/393 |
| 5,338,691 A * | 8/1994 | Enomoto et al. | ............ | 438/57 |
| 5,362,979 A * | 11/1994 | Merchant | .................... | 257/340 |
| 5,413,944 A * | 5/1995 | Lee | ........................... | 438/228 |
| 5,519,237 A * | 5/1996 | Itoh et al. | ................... | 257/306 |
| 5,523,247 A * | 6/1996 | Wright | ...................... | 438/443 |
| 5,525,823 A * | 6/1996 | Chan | ......................... | 257/369 |
| 5,541,455 A * | 7/1996 | Hodges | ...................... | 257/768 |
| 5,552,346 A * | 9/1996 | Huang et al. | ................ | 438/699 |
| 5,573,963 A * | 11/1996 | Sung | ......................... | 438/217 |
| 5,624,857 A * | 4/1997 | Yang | ......................... | 438/420 |
| 5,670,409 A * | 9/1997 | Otori et al. | ................. | 438/211 |
| 5,716,886 A * | 2/1998 | Wen | ........................... | 438/299 |
| 5,766,970 A * | 6/1998 | Kim et al. | ................... | 438/420 |
| 5,777,358 A * | 7/1998 | Yajima | ...................... | 257/306 |
| 5,780,352 A * | 7/1998 | Park et al. | .................. | 438/404 |
| 5,780,900 A * | 7/1998 | Suzuki et al. | ............... | 257/335 |
| 5,795,802 A * | 8/1998 | Ko et al. | .................... | 438/227 |
| 5,815,223 A * | 9/1998 | Watanabe et al. | ............ | 349/42 |
| 5,863,823 A * | 1/1999 | Burgener | .................... | 438/295 |
| 5,880,009 A * | 3/1999 | Wang | ......................... | 438/452 |
| 5,880,039 A * | 3/1999 | Lee | ........................... | 438/763 |
| 5,882,984 A * | 3/1999 | Fan et al. | ................... | 438/440 |
| 5,972,789 A * | 10/1999 | Jeng et al. | .................. | 438/637 |
| 6,150,695 A * | 11/2000 | Gardner et al. | ............. | 257/347 |
| 6,194,257 B1 * | 2/2001 | Kwon | ......................... | 438/199 |
| 6,194,320 B1 * | 2/2001 | Oi | ............................. | 438/703 |
| 6,198,148 B1 * | 3/2001 | Hsu | ........................... | 257/461 |
| 6,211,046 B1 * | 4/2001 | Sekikawa et al. | ........... | 438/586 |
| 6,239,000 B1 * | 5/2001 | Tung | ......................... | 438/425 |
| 6,258,673 B1 * | 7/2001 | Houlihan et al. | ............ | 438/275 |
| 6,271,897 B1 * | 8/2001 | Ichikawa et al. | ............. | 349/43 |
| 6,274,509 B1 * | 8/2001 | Hsieh et al. | ................. | 438/761 |
| 6,277,684 B1 * | 8/2001 | Hayashi et al. | ............ | 438/225 |
| 6,503,778 B1 * | 1/2003 | Yamauchi et al. | ............ | 438/107 |
| 6,583,061 B2 * | 6/2003 | Stevens | .................... | 438/700 |
| 6,673,660 B2 * | 1/2004 | Komatsubara | ............. | 438/156 |
| 6,723,640 B2 * | 4/2004 | Lee et al. | ................... | 438/672 |
| 6,770,507 B2 * | 8/2004 | Abe et al. | ...................... | 438/64 |
| 6,794,219 B1 * | 9/2004 | Stevens et al. | ................ | 438/75 |
| 6,849,887 B2 * | 2/2005 | Nagano et al. | ............. | 257/295 |
| 7,183,179 B2 * | 2/2007 | Droes et al. | ................. | 438/473 |
| 7,192,840 B2 * | 3/2007 | Kanamori | .................... | 438/439 |
| 2001/0029093 A1 * | 10/2001 | Sekikawa et al. | ........... | 438/586 |
| 2001/0036710 A1 * | 11/2001 | Hayashi et al. | ............. | 438/439 |
| 2003/0062587 A1 * | 4/2003 | Sekikawa et al. | ........... | 257/509 |
| 2003/0068870 A1 * | 4/2003 | Komatsubara | ............. | 438/449 |
| 2004/0227192 A1 * | 11/2004 | Yoshida et al. | ............. | 257/371 |
| 2005/0040451 A1 * | 2/2005 | Nakamura | .................. | 257/304 |
| 2005/0062129 A1 * | 3/2005 | Komatsubara | ............. | 257/509 |
| 2005/0079722 A1 * | 4/2005 | Yu | .............................. | 438/706 |
| 2005/0087739 A1 * | 4/2005 | Ogawa et al. | ................. | 257/59 |

FOREIGN PATENT DOCUMENTS

JP            2001-189465           7/2001
KR             0166038 B1       12/1998

OTHER PUBLICATIONS

Second and Supplementary Notice mailed May 18, 2007.
Bruel et al.: "Smart-Cut: A new Silicon On Insulator Material Technology Based on Hydrogen Implantation and Wafer Bonding," Jpn. J. Appl. Phys. vol. 36 (1997), pp. 1636-1641, Part 1, No. 3B, Mar. 1997.

* cited by examiner

US 7,829,400 B2

SEMICONDUCTOR DEVICE FABRICATION METHOD AND SEMICONDUCTOR DEVICE

This application is the U.S. national phase of International Application No. PCT/JP2005/020945 filed 15 Nov. 2005 which designated the U.S. and claims priority to JP 2005-005300 filed 12 Jan. 2005, the entire contents of each of which are hereby incorporated by reference.

TECHNICAL FIELD

The technology presented herein relates to a method for fabricating a semiconductor device and a semiconductor device.

BACKGROUND ART

SOI (Silicon On Insulator) substrates are known as silicon substrates in which a single crystal silicon layer is formed on a surface of an insulating layer. The formation of a device, such as a transistor, on an SOI substrate provides reduced parasitic capacitance and enhanced insulation resistance. This increases the integration density of devices and enhances the device performance. The insulating layer is formed, for example, of a silicon dioxide ($SiO_2$) film.

In order to increase the device operating speed and further reduce the device parasitic capacitance, the single crystal silicon layer of the SOI substrate is preferably formed with a small thickness. There are known SOI substrate fabrication methods for attaining this by attaching a silicon substrate onto another substrate, such as a glass substrate, and then separating and removing part of the silicon substrate (see, for example, Non-patent Document 1).

A description is given below of an SOI substrate fabrication method involving the attachment step as described above with reference to FIGS. 24 to 27. Although the process of thinning the SOI layer can be implemented by various ways including mechanical polishing, chemical polishing and use of porous silicon, the description here is of a process using hydrogen implantation. First, as shown in FIG. 24, a surface of a silicon substrate 201, which is a first substrate, is subjected to oxidation treatment to form a silicon dioxide ($SiO_2$) layer 202 serving as an insulating layer. Next, as shown in FIG. 25, hydrogen is ion-implanted as a peeling material through the silicon dioxide ($SiO_2$) layer 202 into the silicon substrate 201. Thus, a hydrogen implanted layer 204 providing a release layer is formed at a fixed depth in the silicon substrate 201. Subsequently, the substrate is subjected to surface cleaning treatment, such as RCA cleaning. Then, as shown in FIG. 26, for example, a silicon substrate 203 is attached as a second substrate to the surface of the silicon dioxide layer 202. Thereafter, when the layer stack is subjected to heat treatment, microcracks are formed at the depth in the silicon substrate 201 where hydrogen ions are implanted. Thus, as shown in FIG. 27, part of the silicon substrate 201 can be separated off along the hydrogen implanted layer 204. In this manner, the silicon substrate 201 is thinned to form a silicon layer 201. After the separation, if necessary, the silicon layer 201 is thinned to a desired thickness by various methods, such as polishing or etching, and/or subjected to heat treatment to repair crystal defects produced by hydrogen implantation or smooth the silicon surface.

In the above manner, an SOI substrate is fabricated in which a $SiO_2$ layer (insulating layer) 202 is formed on a surface of the silicon substrate (second substrate) 203 and a thin silicon layer 201 is formed on a surface of the $SiO_2$ layer 202.

In forming a plurality of elements on a substrate, a commonly known technique for insulatively separating adjacent devices is to use a LOCOS (Local Oxidation of Silicon) process to form a selective oxide film (hereinafter, referred to as a LOCOS oxide film). A general LOCOS oxide film is fabricated by forming a patterned silicon nitride film over a silicon substrate with an oxide film therebetween and then subjecting the layer stack to oxidation to selectively form an oxide film on a region of the silicon substrate surface not covered with the silicon nitride film. During the formation of the LOCOS oxide film, silicon is consumed by an amount corresponding to approximately 45% of the thickness of the LOCOS oxide film. Therefore, the surface of the LOCOS oxide film becomes higher than the unoxidized surface of the silicon substrate by an approximately half of the thickness of the LOCOS oxide film, thereby forming a level difference.

Non-patent Document 1: Michel Bruel, "Smart-Cut: A New Silicon On Insulator Material Technology Based on Hydrogen Implantation and Wafer Bonding", Jpn. J. Appl. Phys., Vol. 36 (1997), pp. 1636-1641

The inventors found that if a hydrogen implanted layer is formed in a semiconductor substrate having semiconductor elements, such as MOS transistors, and part of the semiconductor substrate is separated off, the semiconductor elements can be fabricated with reduced thickness on another substrate.

Generally, in methods for fabricating a semiconductor device including MOS transistors, it is desirable to reduce the number of process steps by reducing the number of masks used in order to shorten the production time and save the production cost. An exemplary known technique to attain this is to form wells for NMOS and PMOS transistors in a single photolithography process.

Consequently, it can be considered to carry out the above fabrication method found by the inventors using a single photolithography process. A description is given below of the process steps of the fabrication method with reference to FIGS. 28 to 34.

First, as shown in FIG. 28, a thermally oxidized film 102 is formed on top of a silicon substrate 101 and a silicon nitride film 103 is formed on top of the thermally oxidized film 102. Subsequently, the layer stack is subjected to a photolithography step. Specifically, the silicon nitride film 103 is patterned using a resist 104 as a mask. Thereafter, as shown in FIG. 29, an N-type impurity element 105 (for example, phosphorous) is implanted by ion implantation into an N-well forming region of the substrate that is a region thereof corresponding to an opening of the resist 104.

Thereafter, the resist 104 is removed and, as shown in FIG. 30, the silicon substrate 101 is thermally oxidized using the silicon nitride film 103 as a mask, thereby forming an oxide film 106 on top of the N-well forming region. Subsequently, as shown in FIG. 31, the silicon nitride film 103 is removed and a P-type impurity element 107 (for example, boron) is then ion-implanted into the silicon substrate 101 using the oxide film 106 as a mask. As a result, the P-type impurity element 107 is implanted into a P-well forming region of the silicon substrate 101 on which the oxide film 106 is not formed.

Next, the thermally oxidized film 102 and the oxide film 106 are removed and the silicon substrate 101 is then thermally treated in an oxidized atmosphere. Thus, as shown in FIG. 32, a thermally oxidized film 108 is formed on the substrate surface and the impurity elements 105 and 107 implanted into the N-well and P-well forming regions are diffused to form an N-well region 109 and a P-well region 110. At this time, the substrate surface is formed to have different levels: the surface of the N-well region 109 on which the oxidized film 106 had been formed is lower than the surface of the P-well region 110.

Although a detailed description is not given of the later process steps, as shown in FIG. 33, an NMOS transistor 111 and a PMOS transistor 112 are formed in the N-well region 109 and the P-well region 110, respectively.

Each of the NMOS transistor 111 and the PMOS transistor 112 includes a gate oxide film 113, a LOCOS oxide film 114, a gate electrode 115 and sidewalls 116. The NMOS transistor 111 further includes N-type high-concentration impurity regions 119 and N-type low-concentration impurity regions 120, while the PMOS transistor 112 further includes P-type high-concentration impurity regions 117 and P-type low-concentration impurity regions 118.

Subsequently, in order to form the semiconductor elements with reduced thickness on another substrate, as shown in FIG. 34, an insulating film such as $SiO_2$ is formed over the layer stack and a planarizing film 121 is then formed on the insulating film by a planarization process, such as CMP (Chemical Mechanical Polishing). Thereafter, hydrogen is ion-implanted into the silicon substrate 101 to form a hydrogen implanted layer 122.

A description is given below of the reason why the planarizing film 121 is formed prior to the hydrogen ion implantation. If, as shown in FIG. 33, a gate electrode 115 and other parts are provided to project from the substrate surface, the substrate surface will have steep steps formed. If steep steps are formed on the substrate surface through which hydrogen is ion-implanted, a hydrogen implanted layer formed in the silicon substrate 101 will have steep steps formed in correspondence with the above steps on the substrate surface. The inventors' experiment has demonstrated that where the hydrogen implanted layer is formed to have steep steps, a region of the silicon substrate 101 cannot be well separated off along the hydrogen implanted layer during heat treatment. In particular, the region of the silicon substrate 101 to be separated off is partly left on the silicon substrate 101 at the steep steps of the hydrogen implanted layer, which makes it difficult to form the semiconductor elements with reduced thickness on another substrate.

For the above reason, in order to surely separate part of the silicon substrate 101 off from the hydrogen implanted layer, it is essential to form a planarizing film 121 to planarize the substrate surface prior to the hydrogen ion implantation. However, as shown in FIG. 34, the hydrogen implanted layer 122 is formed at a fixed depth from the surface of the planarizing film 121 but the NMOS transistor 111 and the PMOS transistor 112 are formed with a level difference between them. Therefore, when the semiconductor elements are separated at the hydrogen implanted layer 122 and formed with thus reduced thickness on another substrate, the thickness a of the silicon layer of the PMOS transistor 112 is different from the thickness b of the silicon layer of the NMOS transistor 111.

The thickness of the silicon layer has a significant effect on electrical properties of the transistors, such as parasitic capacitance, switching voltage threshold value and subthreshold characteristics. Therefore, if, as above, the NMOS transistor 111 and the PMOS transistor 112 have different silicon layer thicknesses, their electrical properties are unbalanced and their silicon layer thicknesses become hard to control.

Furthermore, for full-depletion SOI transistors, it is necessary to restrict the thickness of the silicon layer within the range from 50 to 100 nm, both inclusive. If the silicon layers of the NMOS transistor 111 and the PMOS transistor 112 have different thicknesses as mentioned above, the silicon layer of one of these transistors may be thicker or thinner than that of the other transistor by adjusting the thickness of the silicon layer of the other transistor to 50 to 100 nm. This causes a problem that the silicon layers of both the NMOS transistor 111 and the PMOS transistor 112 cannot be formed to have appropriate thicknesses.

The example embodiment presented herein has been made in view of the foregoing points and, therefore, a feature is to form a plurality of element forming surfaces of different heights on a semiconductor layer in which a release layer is to be formed and form semiconductor elements, one on each of the element forming surfaces, thereby forming associated portions of the semiconductor layer in the semiconductor elements with the same thickness.

SUMMARY

To attain the above feature, a level-difference compensation insulating film is formed on the semiconductor layer to cover the semiconductor elements and have a surface with different levels along the element forming surfaces.

Specifically, a method for fabricating a semiconductor device according to an example embodiment comprises: an element forming surface formation step of forming a plurality of element forming surfaces of different heights on a semiconductor layer to have different levels; a semiconductor element formation step of forming a plurality of semiconductor elements, one in each of a corresponding number of regions of the semiconductor layer, each region including an associated one of the plurality of element forming surfaces; a level-difference compensation insulating film formation step of forming a level-difference compensation insulating film on the semiconductor layer to cover the semiconductor elements and have a surface with different levels along the element forming surfaces; a release layer formation step of forming a release layer in the semiconductor layer by ion-implanting a peeling material through the level-difference compensation insulating film into the semiconductor layer; and a separation step of separating part of the semiconductor layer along the release layer.

The level-difference compensation insulating film formation step preferably comprises: an insulating film deposition step of depositing an insulating film having a flat surface onto the semiconductor layer to cover the semiconductor elements; and a shaping step of shaping the surface of the insulating film to have different levels along the element forming surfaces.

The shaping step may comprise shaping the surface of the insulating film by etching.

The method may further comprise: a planarizing film formation step of forming a planarizing film to cover the level-difference compensation insulating film; and an attachment step of attaching a substrate onto the surface of the planarizing film.

The attachment step is preferably performed prior to the separation step.

The element forming surface formation step may comprise forming the element forming surfaces to have different levels by forming a selective oxide film on the semiconductor layer using a mask layer formed by photolithography.

The semiconductor layer is preferably a silicon layer.

The peeling material is preferably composed of at least one of hydrogen and inert gas.

The semiconductor elements may be MOS transistors.

An aspect of a semiconductor device according to an example embodiment comprises: a semiconductor layer having a plurality of element forming surfaces of different heights formed to have different levels; a plurality of semiconductor elements formed one in each of a corresponding number of regions of the semiconductor layer, each region including an associated one of the element forming surfaces; and a level-difference compensation insulating film formed on the semiconductor layer to cover the semiconductor elements and have a surface with different levels along the element forming surfaces, part of the semiconductor layer being separated along a release layer formed by ion-implanting a peeling material into the semiconductor layer.

Another aspect of a semiconductor device according to an example embodiment comprises: a semiconductor layer having a plurality of element forming surfaces of different heights formed to have different levels; a plurality of semiconductor elements formed one in each of a corresponding number of regions of the semiconductor layer, each region including an associated one of the element forming surfaces; and a level-difference compensation insulating film formed on the semiconductor layer to cover the semiconductor elements and have a surface with different levels along the element forming surfaces, the semiconductor layer being formed with a fixed thickness.

The semiconductor device may further comprise a planarizing film covering the level-difference compensation insulating film; and a substrate attached onto the surface of the planarizing film.

The substrate is preferably a glass substrate.

The semiconductor layer is preferably a silicon layer.

The peeling material is preferably composed of at least one of hydrogen and inert gas.

The semiconductor elements may be MOS transistors.

Next, a description is given of the operation of the example embodiment presented herein.

In fabricating a semiconductor device, first in the element forming surface formation step, a plurality of element forming surfaces of different heights are formed on a semiconductor layer made for example of a silicon layer to have different levels. For example, in the element forming surface formation step, the element forming surfaces can be formed to have different levels by forming a selective oxide film on the semiconductor layer using a mask layer formed by photolithography.

Subsequently, in the semiconductor element formation step, semiconductor elements, such as MOS transistors, are formed one in each of a corresponding number of regions of the semiconductor layer, each region including an associated one of the element forming surfaces. At this time, since the semiconductor elements are formed on the element forming surfaces, the surface of the semiconductor layer has relatively steep irregularities.

Next, in the level-difference compensation insulating film formation step, a level-difference compensation insulating film is formed on the semiconductor layer to cover the semiconductor elements and have a surface with different levels along the element forming surfaces. The level-difference compensation insulating film formation step can be implemented by the insulating film deposition step and the shaping step. Specifically, first in the insulating film deposition step, an insulating film having a flat surface is deposited onto the semiconductor layer to cover the semiconductor elements. Subsequently, in the shaping step, the surface of the insulating film is shaped to have different levels along the element forming surfaces, for example, by etching. Thus, the surface of the semiconductor layer having the irregularities is formed into a relatively gently shelving surface and the level-difference compensation insulating film on the element forming surfaces is formed with a fixed thickness.

Thereafter, in the release layer formation step, a release layer is formed in the semiconductor layer by ion-implanting a peeling material, such as hydrogen or inert gas, through the level-difference compensation insulating film into the semiconductor layer. The release layer is formed at a fixed depth from the surface of the level-difference compensation insulating film through which the peeling material is ion-implanted. Therefore, the release layer is formed to have different levels along the level-difference compensation insulating film and the element forming surfaces. In other words, the release layer is formed at a fixed depth from the element forming surfaces.

Next, in the separation step, part of the semiconductor layer is separated off along the release layer. As a result, since the release layer is formed to have different levels along the element forming surfaces, the remaining semiconductor layer is formed with a fixed thickness. Therefore, the plurality of semiconductor elements thus formed can have the same electrical properties and the thickness of the semiconductor layer in each of the semiconductor elements can be appropriately controlled.

Furthermore, the planarizing film formation step and the attachment step can be performed prior to the separation step. Specifically, in the planarizing film formation step, a planarizing film is formed to cover the level-difference compensation insulating film. Subsequently, in the attachment step, a substrate, such as a glass substrate, is attached onto the surface of the planarizing film.

According to the example embodiment presented herein, the formation of a level-difference compensation insulating film having a surface with different levels along the element forming surfaces enables a release layer to be formed at a fixed depth from the element forming surfaces by ion implantation. Therefore, the semiconductor layer left after separation can be formed with a fixed thickness. As a result, the electrical properties of the plurality of semiconductor elements thus formed can be uniformized and the thickness of the semiconductor layer in each of the semiconductor elements can be appropriately controlled.

BRIEF EXPLANATION OF REFERENCE CHARACTERS

Figure 1:
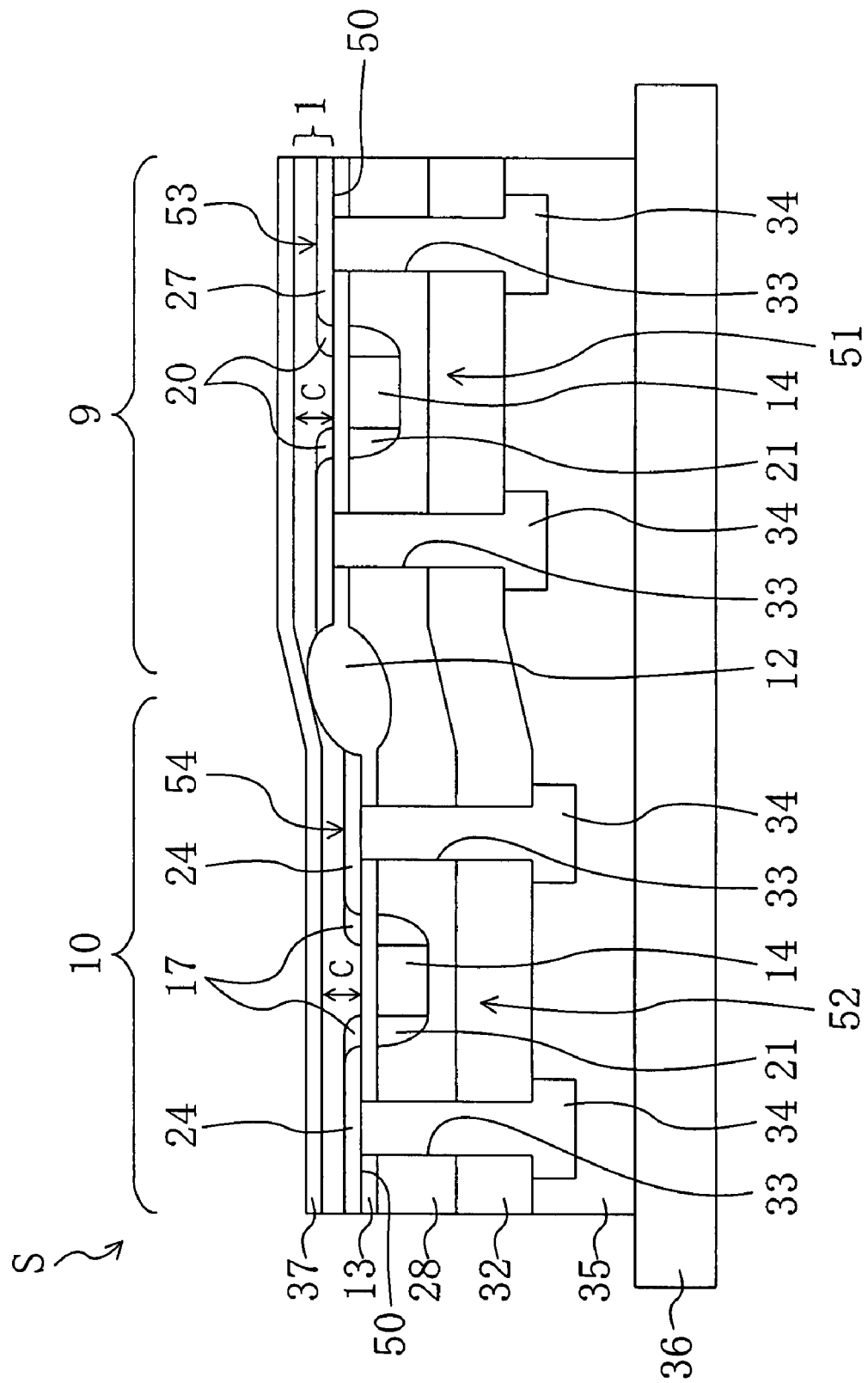
FIG. 1 is a cross-sectional view showing the structure of a semiconductor device according to Embodiment 1.

S semiconductor device
1 semiconductor layer (silicon layer), semiconductor substrate
6 selective oxide film
28 level-difference compensation insulating film (insulating film)
29 resist
30 peeling material
31 release layer
35 planarizing film
36 glass substrate (substrate)
50 element forming surface
51 PMOS transistor (semiconductor element)
52 NMOS transistor (semiconductor element)

BEST MODE

A detailed description is given below of embodiments of the present invention with reference to the drawings. However, the present invention is not limited to the following embodiments.

Embodiment 1

FIGS. 1 to 22 show a semiconductor device S and its fabrication method according to Embodiment 1.

FIG. 1 is a cross-sectional view showing the structure of the semiconductor device S. As shown in FIG. 1, the semiconductor device S includes: a glass substrate 36, a planarizing film 35, an interlayer insulating film 32, a level difference compensation insulating film 28, a gate oxide film 13, a semiconductor layer 1 and a protective film 37, which are stacked on the glass substrate 36, and also includes a plurality of semiconductor elements 51 and 52.

The semiconductor layer 1 is formed, for example, of a silicon layer and a plurality of element forming surfaces 50 of different heights are formed on a bottom surface of the semiconductor layer 1 when viewed in FIG. 1 to have different levels. The semiconductor layer 1 includes an N-well region 9 and a P-well region 10 separated from each other by a LOCOS oxide film 12 serving as an isolation film. The N-well region 9 and the P-well region 10 have their respective element forming surfaces 50 formed thereon. As shown in FIG. 1, the element forming surface 50 of the N-well region 9 is formed at a higher level than that of the P-well region 10.

The N-well region 9 of the semiconductor layer 1 is formed with an active region 53 including P-type low-concentration impurity regions 20 and P-type high-concentration impurity regions 27 that are doped with a P-type impurity element, such as boron. The P-well region 10 of the semiconductor layer 1 is formed with an active region 54 including N-type low-concentration impurity regions 17 and N-type high-concentration impurity regions 24 that are doped with an N-type impurity element, such as phosphorus.

Another surface of the semiconductor layer 1 opposite to the element forming surfaces 50 (i.e., a top surface thereof in FIG. 1) is also formed to have different levels along the element forming surfaces 50. Therefore, the semiconductor layer 1 is formed with a fixed thickness. As described later, the top surface of the semiconductor layer 1 is formed by separating part of an original semiconductor layer 1 off along a release layer 31 formed by ion-implanting a peeling material 30 into the original semiconductor layer 1. The protective film 37 is formed of an insulating layer and provided to protect the top surface of the semiconductor layer 1.

The semiconductor elements 51 and 52 are MOS transistors: one of the MOS transistors is a PMOS transistor 51 formed in the N-well region 9 including the associated element forming surface 50 and the other is an NMOS transistor 52 formed in the P-well region 10 including the associated element forming surface 50. In other words, the PMOS transistor 51 and the NMOS transistor 52 are formed at different heights from the glass substrate 36.

The PMOS transistor 51 includes the active region 53, the gate oxide film 13 covering the associated element forming surface 50 and a gate electrode 14 formed above the element forming surface 50 with the gate oxide film 13 therebetween. The gate electrode 14 has sidewalls 21 formed on the right and left sides thereof. A part of the active region 53 above the gate electrode 14 is formed into a channel region and parts of the active region 53 above the sidewalls 21 are formed into respective P-type low-concentration impurity regions 20. The P-type high-concentration impurity regions 27 are formed on the outsides of the P-type low-concentration impurity regions 20.

The NMOS transistor 52 includes the active region 54, the gate oxide film 13 covering the associated element forming surface 50 and a gate electrode 14 formed above the element forming surface 50 with the gate oxide film 13 therebetween. The gate electrode 14 has sidewalls 21 formed on the right and left sides thereof. A part of the active region 54 above the gate electrode 14 is formed into a channel region and parts of the active region 54 above the sidewalls 21 are formed into respective N-type low-concentration impurity regions 17. The N-type high-concentration impurity regions 24 are formed on the outsides of the N-type low-concentration impurity regions 17.

The level-difference compensation insulating film 28 covers the PMOS transistor 51 and the NMOS transistor 52 on the opposite side to the semiconductor layer 1 and has a surface with different levels along the element forming surfaces 50. Thus, the level-difference compensation insulating film 28 compensates for steep steps formed by the gate electrodes 14 and the sidewalls 21 to form a relatively gently shelving surface. The interlayer insulating film 32 is formed to cover the level-difference compensation insulating film 28 with a uniform thickness. The planarizing film 35 is formed of an insulating film and disposed to cover the level-difference compensation insulating film 28 with the interlayer insulating film 32 therebetween. The bottom surface of the planarizing film 35 is formed into a flat surface.

Contact holes 33 are formed through the gate oxide film 13, the level-difference compensation insulating film 28 and the interlayer insulating film 32. Each contact hole 33 is formed with an electrode 34 so as to be connected to the associated N-type high-concentration impurity region 24 or the associated P-type high-concentration impurity region 27.

The glass substrate 36 is attached to the flat surface of the planarizing film 35. As can be seen from the above, the semiconductor device S of this embodiment includes a plurality of MOS transistors 51, 52 provided over the glass substrate 36 with a plurality of insulating films including the level-difference compensation insulating film 28 interposed therebetween and separated from each other by the LOCOS oxide film 12.

—Fabrication Method of Semiconductor Device—

Next, a description is given of a method for fabricating a semiconductor device according to an example embodiment with reference to FIGS. 1 to 22.

The fabrication method according to this embodiment includes an element forming surface formation step, a semiconductor element formation step, a level-difference compensation insulating film formation step, a release layer formation step, an electrode formation step, a planarizing film formation step, an attachment step and a separation step.

First, in the element forming surface formation step, a plurality of element forming surfaces 50 of different heights are formed on a semiconductor substrate 1 providing a semiconductor layer 1 to have different levels. In the element forming surface formation step, the element forming surfaces are formed to have different levels by forming a selective oxide film on the semiconductor substrate 1 using a mask layer (a resist 4) formed by photolithography.

Figure 2:
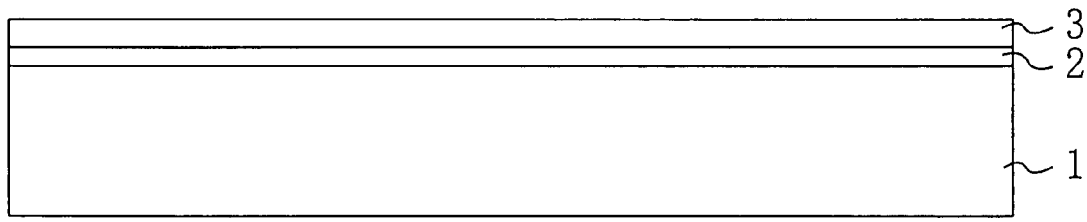
FIG. 2 is a cross-sectional view showing a thermally oxidized film and a silicon nitride film formed in an element forming surface formation step.
Figure 3:
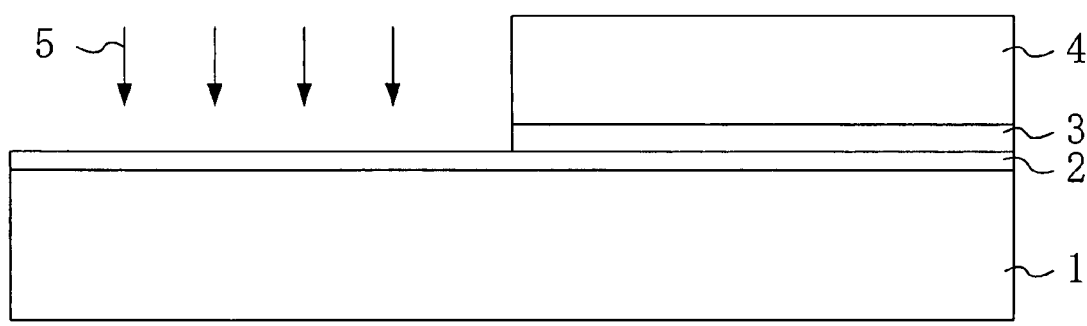
FIG. 3 is a cross-sectional view showing a state in which an N-type impurity element is ion-implanted in the element forming surface formation step.

Specifically, as shown in FIG. 2, a thermally oxidized film 2 is formed on top of the semiconductor substrate 1 and a silicon nitride film 3 is then formed on top of the thermally oxidized film 2. Subsequently, the layer stack is subjected to a photolithography process. To be more specific, the silicon nitride film 3 is patterned using the resist 4 as a mask. Thereafter, as shown in FIG. 3, an N-type impurity element 5 (for example, phosphorous) is implanted by ion implantation into an N-well forming region of the semiconductor substrate 1 that is a region thereof corresponding to an opening of the resist 4.

Figure 4:
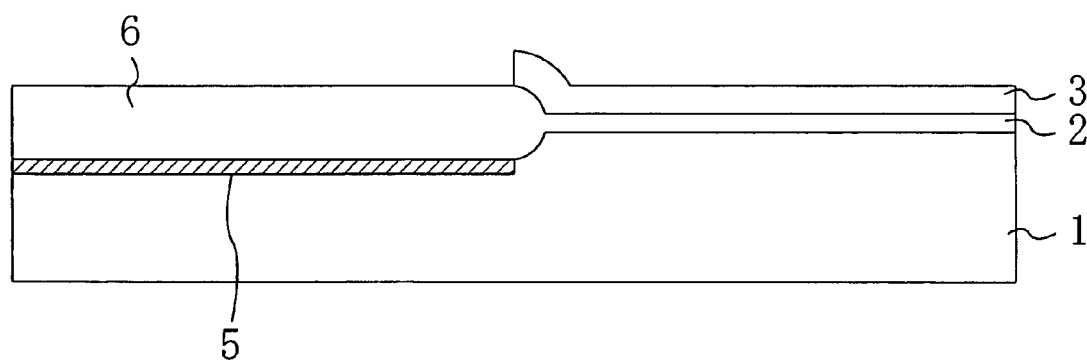
FIG. 4 is a cross-sectional view showing a selective oxide film formed in the element forming surface formation step.
Figure 5:
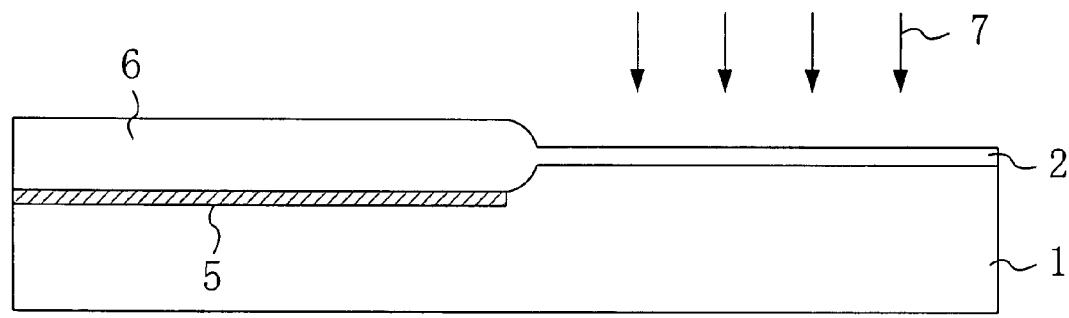
FIG. 5 is a cross-sectional view showing a state in which a P-type impurity element is ion-implanted in the element forming surface formation step.

Thereafter, the resist 4 is removed and, as shown in FIG. 4, the semiconductor substrate 1 is thermally oxidized using the silicon nitride film 3 as a mask, thereby forming a selective oxide film 6 on top of the N-well forming region. Subsequently, as shown in FIG. 5, the silicon nitride film 3 is removed and a P-type impurity element 7 (for example, boron) is then ion-implanted into the semiconductor substrate 1 using the selective oxide film 6 as a mask. As a result, the P-type impurity element 7 is implanted into a P-well forming region of the semiconductor substrate 1 on which the selective oxide film 6 is not formed.

Figure 6:
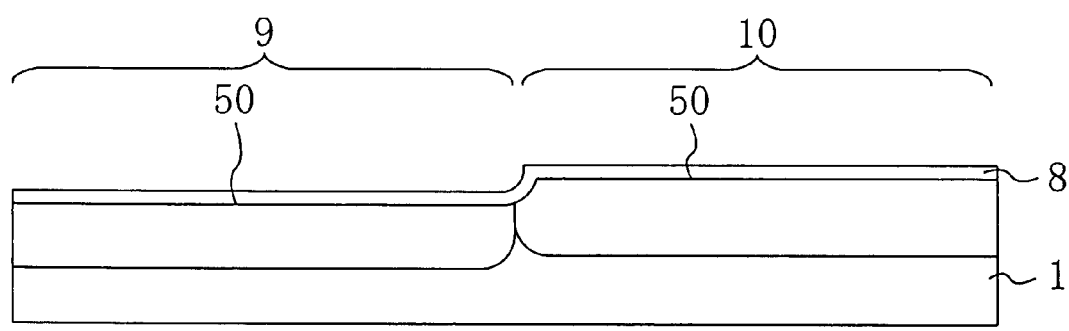
FIG. 6 is a cross-sectional view showing element forming surfaces formed in the element forming surface formation step.

Next, the thermal oxide film 2 and the selective oxide film 6 are removed and the semiconductor substrate 1 is then thermally treated in an oxidized atmosphere. Thus, as shown in FIG. 6, a thermally oxidized film 8 is formed on the substrate surface and the impurity elements 5 and 7 implanted into the N-well and the P-well forming regions are diffused to form an N-well region 9 and a P-well region 10. Thus, element forming surfaces 50 with different heights are formed on the surface of the semiconductor substrate 1 to have different levels. The surface of the N-well region 9 on which the selective oxide film 6 had been formed becomes lower than the surface of the P-well region 10.

Subsequently, a semiconductor element formation step is performed. In the semiconductor element formation step, at least respective active regions 53 and 54 and respective gate electrodes 14 of a PMOS transistor 51 and an NMOS transistor 52 are formed in the N-well region 9 and the P-well region 10 including the element forming surfaces 50.

Figure 7:
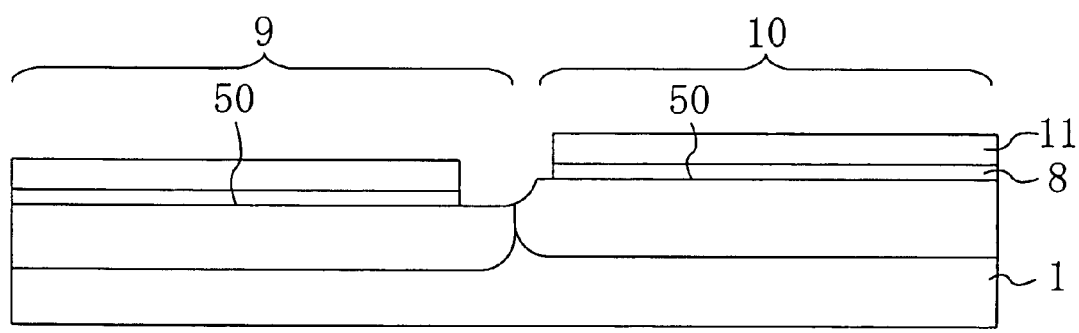
FIG. 7 is a cross-sectional view showing a silicon nitride film and a thermally oxidized film that are patterned in a semiconductor element formation step.
Figure 8:
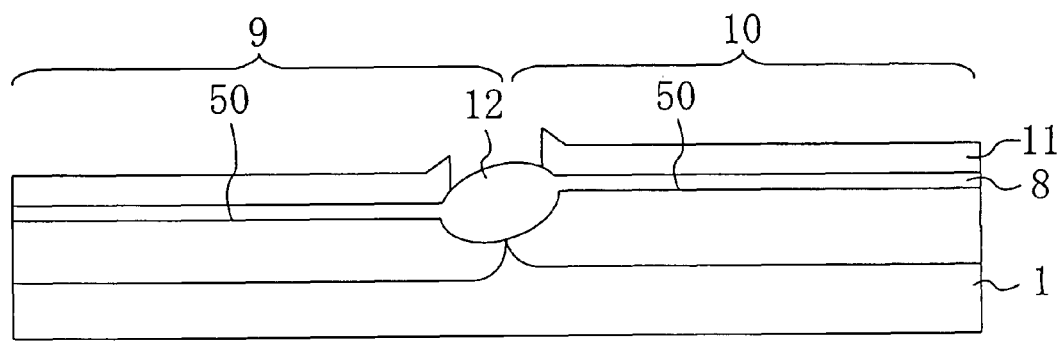
FIG. 8 is a cross-sectional view showing a LOCOS oxide film formed in the semiconductor element formation step.
Figure 9:
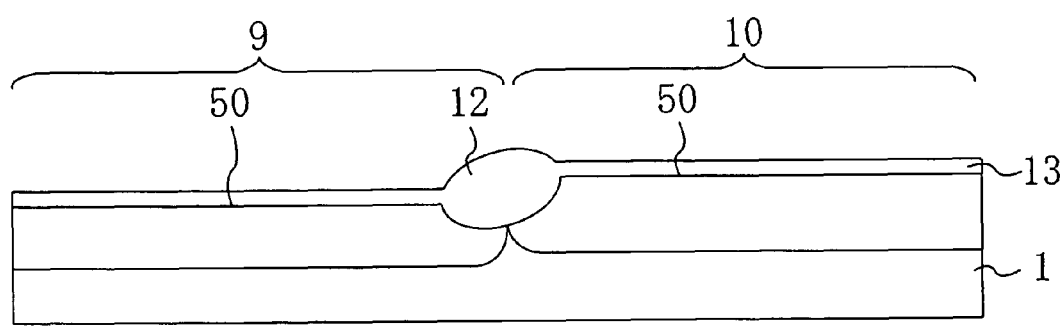
FIG. 9 is a cross-sectional view showing gate electrodes formed in the semiconductor element formation step.

First, a LOCOS oxide film 12 is formed in a boundary region of the layer stack between the N-well region 9 and the P-well region 10. Specifically, as shown in FIG. 7, a silicon nitride film 11 is formed on the thermally oxidized film 8 and the silicon nitride film 11 and the thermally oxidized film 8 are then patterned. Thus, an opening is formed in the boundary region between the N-well region 9 and the P-well region 10. Next, as shown in FIG. 8, the layer stack is subjected to LOCOS oxidation to form a LOCOS oxide film 12 in the opening. Thereafter, as shown in FIG. 9, the silicon nitride film 11 and the thermally oxidized film 8 are removed and a gate oxide film 13 is then formed on the layer stack.

Figure 10:
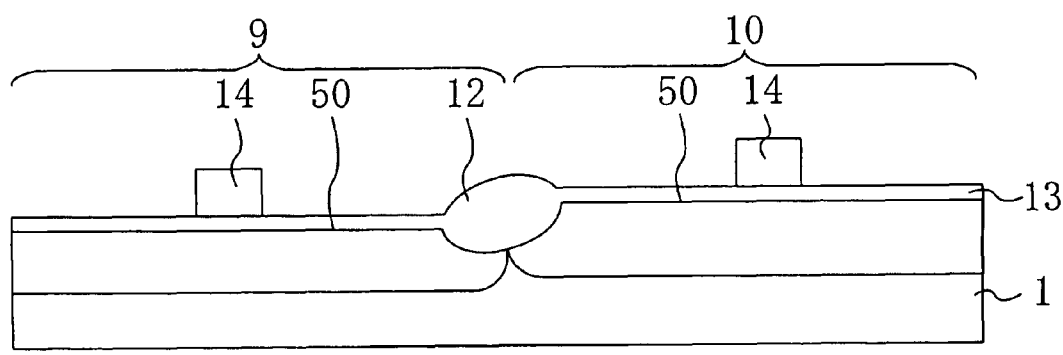
FIG. 10 is a cross-sectional view showing a gate insulating film formed in the semiconductor element formation step.
Figure 11:
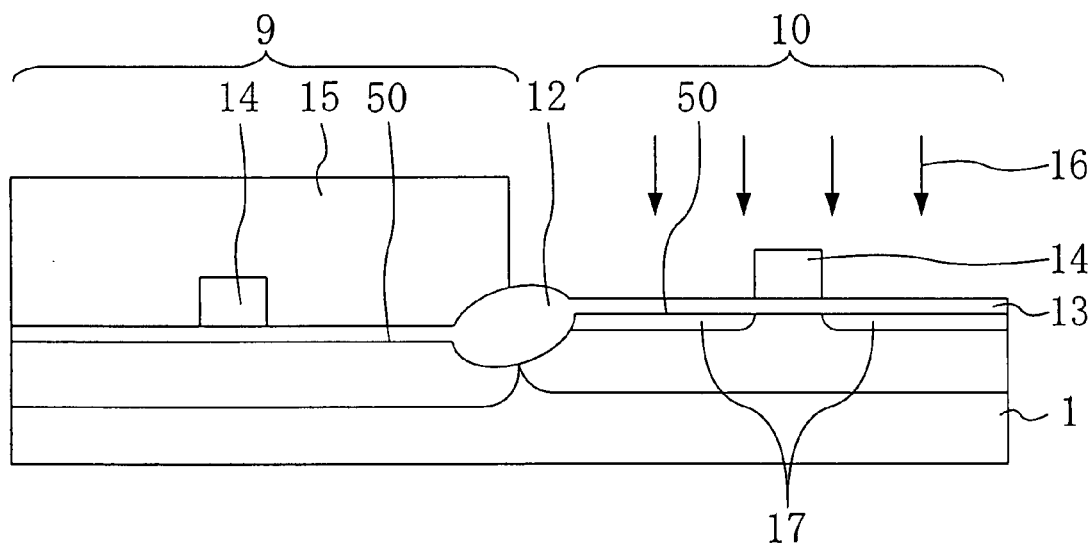
FIG. 11 is a cross-sectional view showing an N-type low-concentration impurity region formed in the semiconductor element formation step.

Subsequently, as shown in FIG. 10, gate electrodes 14 are formed by patterning on their respective positions of the gate oxide film 13 in the N-well region 9 and the P-well region 10. Thereafter, as shown in FIG. 11, a resist 15 is formed on the layer stack so that the P-well region 10 opens and an N-type impurity element 16, such as phosphorous, is ion-implanted into the P-well region 10 using the associated gate electrode 14 as a mask. Thus, N-type low-concentration impurity regions 17 are formed in the P-well region 10.

Figure 12:
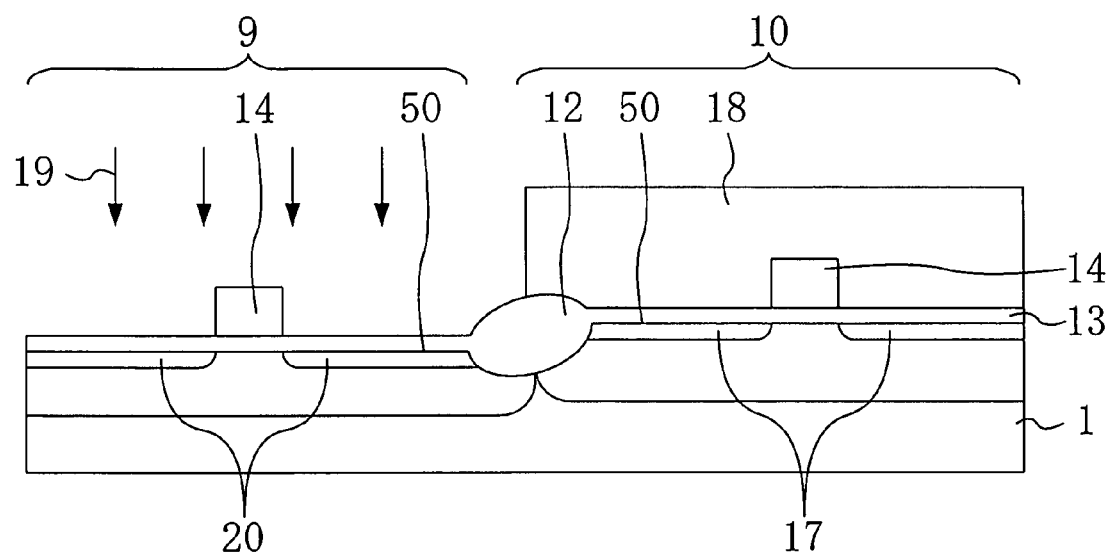
FIG. 12 is a cross-sectional view showing a P-type low-concentration impurity region formed in the semiconductor element formation step.

Next, as shown in FIG. 12, a resist 18 is formed on the layer stack so that the N-well region 9 opens and a P-type impurity element 19, such as boron, is ion-implanted into the N-well region 9 using the associated gate electrode 14 as a mask. Thus, P-type low-concentration impurity regions 20 are formed in the N-well region 9.

Figure 13:
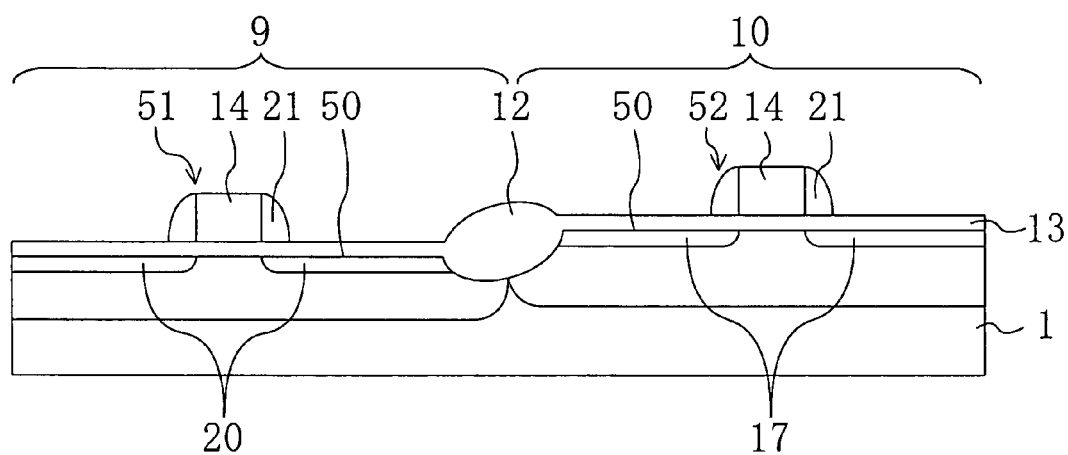
FIG. 13 is a cross-sectional view showing sidewalls formed in the semiconductor element formation step.
Figure 14:
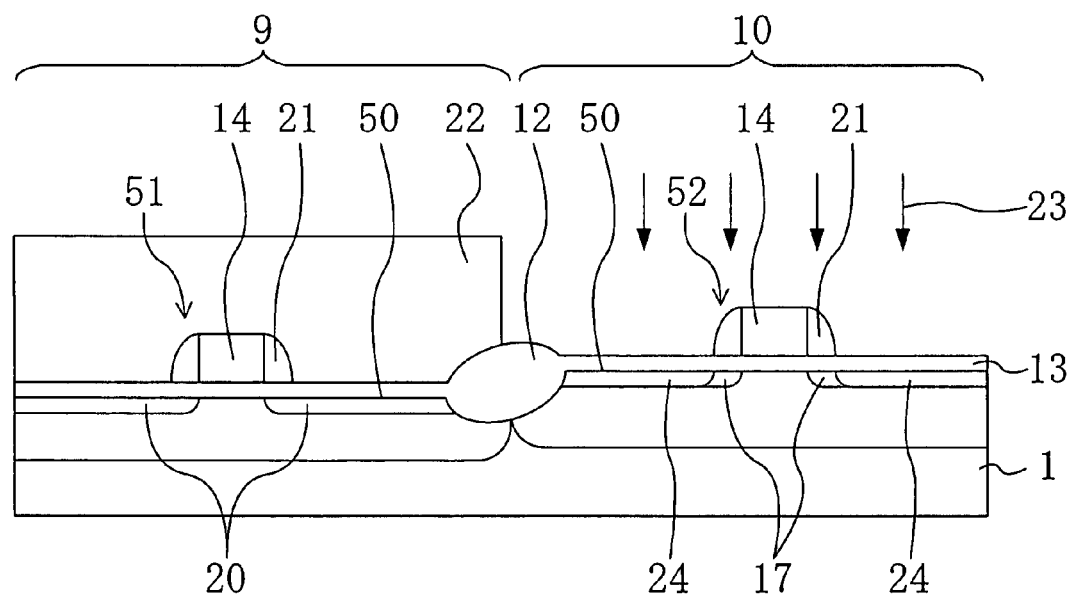
FIG. 14 is a cross-sectional view showing an N-type high-concentration impurity region formed in the semiconductor element formation step.

Thereafter, a $SiO_2$ film is formed on the layer stack by CVD or other deposition methods and, as shown in FIG. 13, the layer stack is then subjected to anisotropic dry etching to form sidewalls 21 of $SiO_2$ on both lateral wall surfaces of the each gate electrode 14. Subsequently, as shown in FIG. 14, a resist 22 is formed on the layer stack so that the P-well region 10 opens and an N-type impurity element 23, such as phosphorous, is ion-implanted into the P-well region 10 using the associated gate electrode 14 and sidewalls 21 as a mask. Thus, N-type high-concentration impurity regions 24 are formed on the outsides of the N-type low-concentration impurity regions 17.

Figure 15:
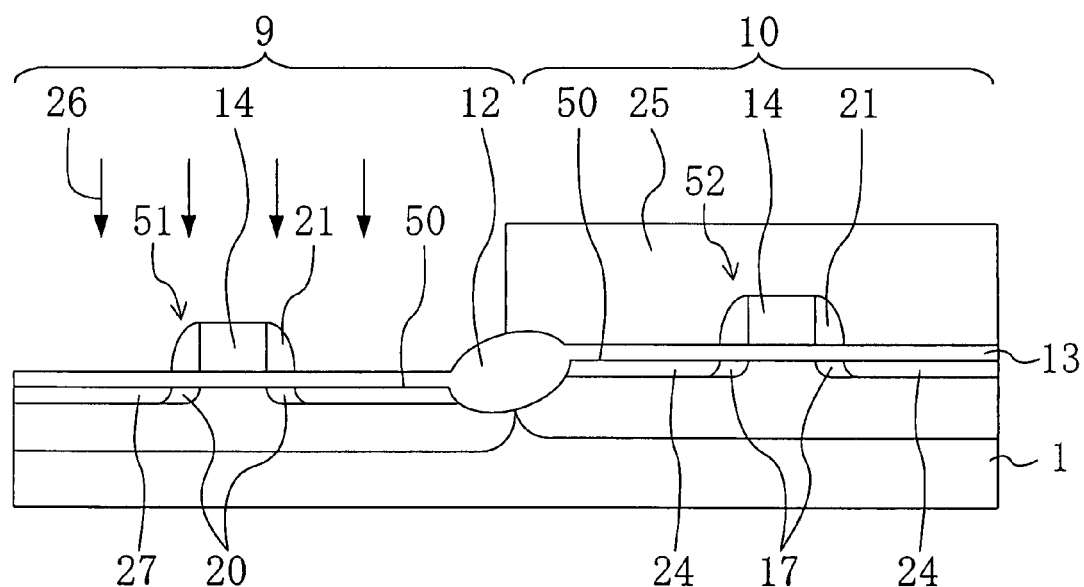
FIG. 15 is a cross-sectional view showing a P-type high-concentration impurity region formed in the semiconductor element formation step.

Next, as shown in FIG. 15, a resist 25 is formed on the layer stack so that the N-well region 9 opens and a P-type impurity element 26, such as boron, is ion-implanted into the N-well region 9 using the associated gate electrode 14 and sidewalls 21 as a mask. Thus, P-type high-concentration impurity regions 27 are formed on the outsides of the P-type low-concentration impurity regions 20. Thereafter, the layer stack is thermally treated to activate the ion-implanted impurity elements.

In the above manner, the N-well region 9 is formed with the active region 53, the gate electrode 14 and the sidewalls 21 for the PMOS transistor 51, while the P-well region 10 is formed with the active region 54, the gate electrode 14 and the sidewalls 21 for the NMOS transistor 52. At this time, since the gate electrodes 14 and the sidewalls 21 are formed above the element forming surfaces 50 with the gate oxide film 13 therebetween to project from the gate oxide film 13, the top surface of the semiconductor substrate 1 has relatively steep irregularities.

In a level-difference compensation insulating film formation step performed next, a level-difference compensation insulating film 28 is formed on the semiconductor substrate 1 to cover the gate electrodes 14 and the other parts of the PMOS transistor 51 and NMOS transistor 52 and have a surface with different levels along the element forming surfaces 50. The level-difference compensation insulating film formation step is implemented by an insulating film deposition step and a shaping step.

Figure 16:
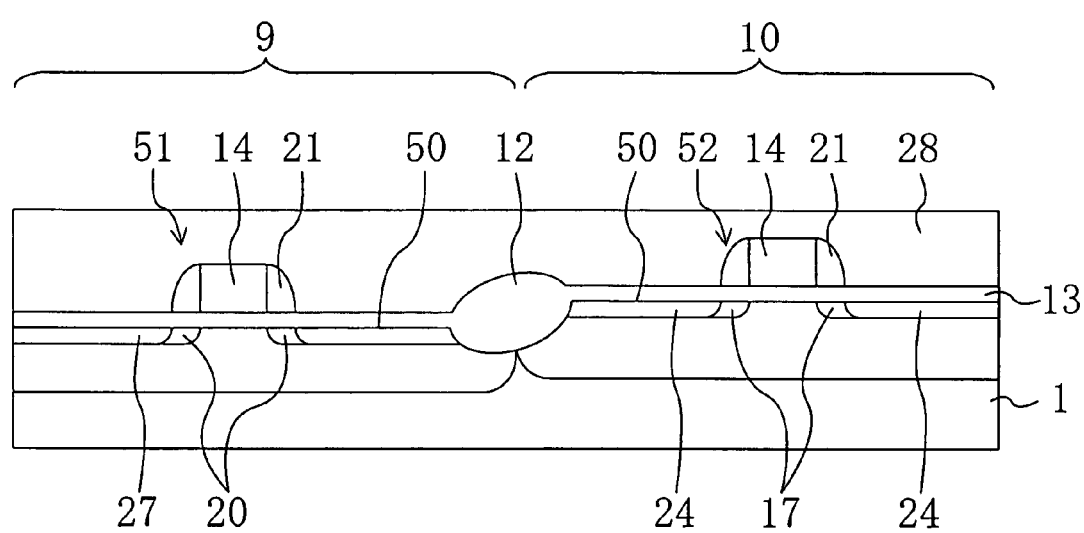
FIG. 16 is a cross-sectional view showing an insulating film formed in an insulating film deposition step.
Figure 17:
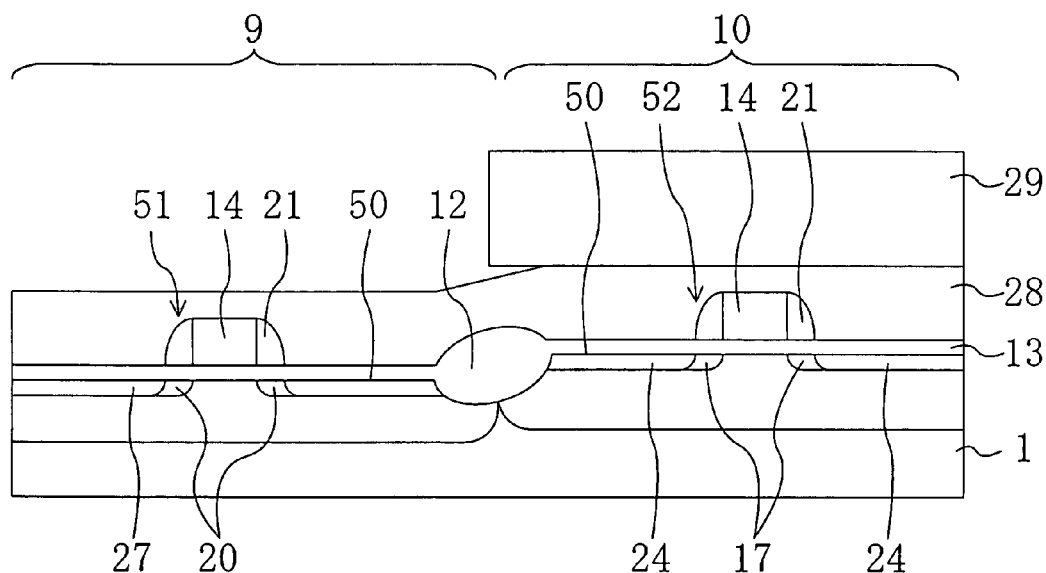
FIG. 17 is a cross-sectional view showing a level-difference compensation insulating film formed in a shaping step.

Specifically, first in the insulating film deposition step, as shown in FIG. 16, an insulating film 28, such as $SiO_2$, is deposited onto the semiconductor substrate 1 to cover the gate electrodes 14 and the other parts of the PMOS transistor 51 and NMOS transistor 52 and then planarized by CMP or other planarization techniques. In other words, the insulating film 28 having a flat surface is deposited on the semiconductor substrate 1. Subsequently, in the shaping step, as shown in FIG. 17, the insulating film 28 is etched away by a level difference between the gate oxide films 13 of the N-well region 9 and the P-well region 10 (i.e., a level difference between the element forming surfaces 50) using as a mask a resist 29 formed over the P-well region 10 by patterning, thereby thinning the insulating film 28. Thus, the level-difference compensation insulating film 28 is formed.

At this time, the boundary region between the thinned region and the non-thinned region preferably forms a gentle shelving. Examples of suitable etching methods include isotropic dry etching and wet etching. In this manner, the top surface of the semiconductor substrate 1 is covered with the level-difference compensation insulating film 28 having a relatively gently shelving surface.

Figure 18:
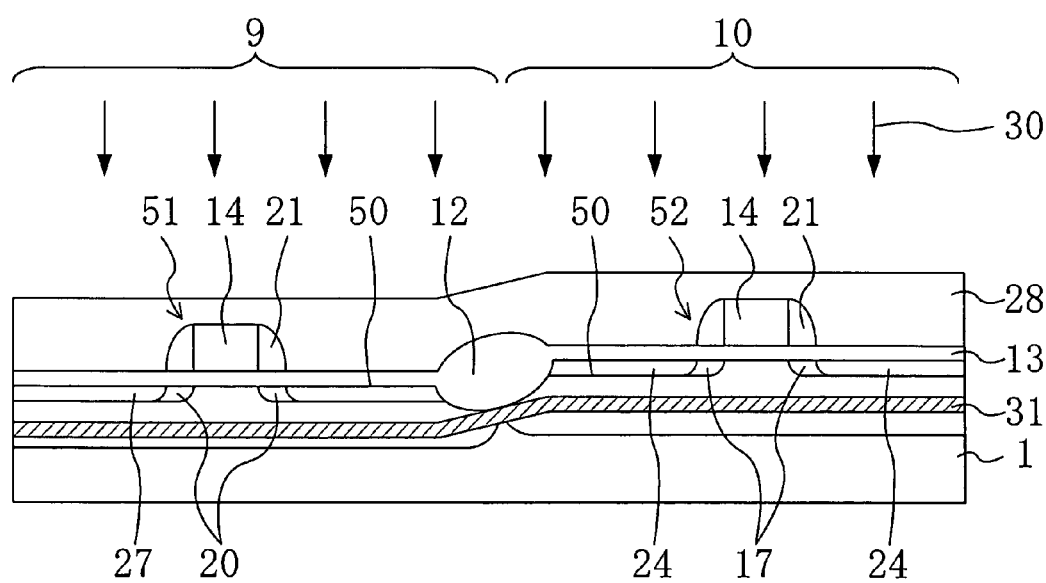
FIG. 18 is a cross-sectional view showing a release layer formed in a release layer formation step.

Next, a release layer formation step is performed. In the release layer formation step, as shown in FIG. 18, the resist 29 is removed and hydrogen or inert gas, such as helium or neon, serving as a peeling material 30 is then ion-implanted through the level-difference compensation insulating film 28 into the semiconductor substrate 1. Thus, a release layer 31 is formed in the semiconductor substrate 1. Note that the peeling material 30 can be composed of at least one of hydrogen and inert gas. At this time, since the release layer 31 is formed at a fixed depth from the surface of the level-difference compensation insulating film 28, it is formed to have different levels along the level-difference compensation insulating film 28 and the element forming surfaces 50. In other words, the release layer 31 is formed at a fixed depth from the element forming surfaces 50.

Figure 19:
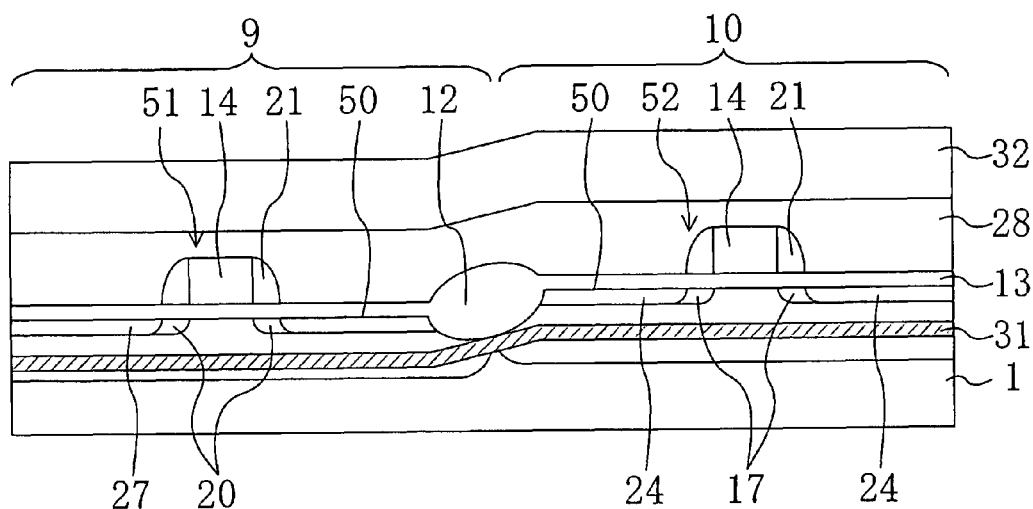
FIG. 19 is a cross-sectional view showing an interlayer insulating film formed in an electrode formation step.

In an electrode formation step performed next, as shown in FIG. 19, an interlayer insulating film 32 is formed by depositing a $SiO_2$ film with a specified thickness on the level-difference compensation insulating film 28. The surface of the interlayer insulating film 32 is formed to have different levels along the surface of the level-difference compensation insulating film 28.

Figure 20:
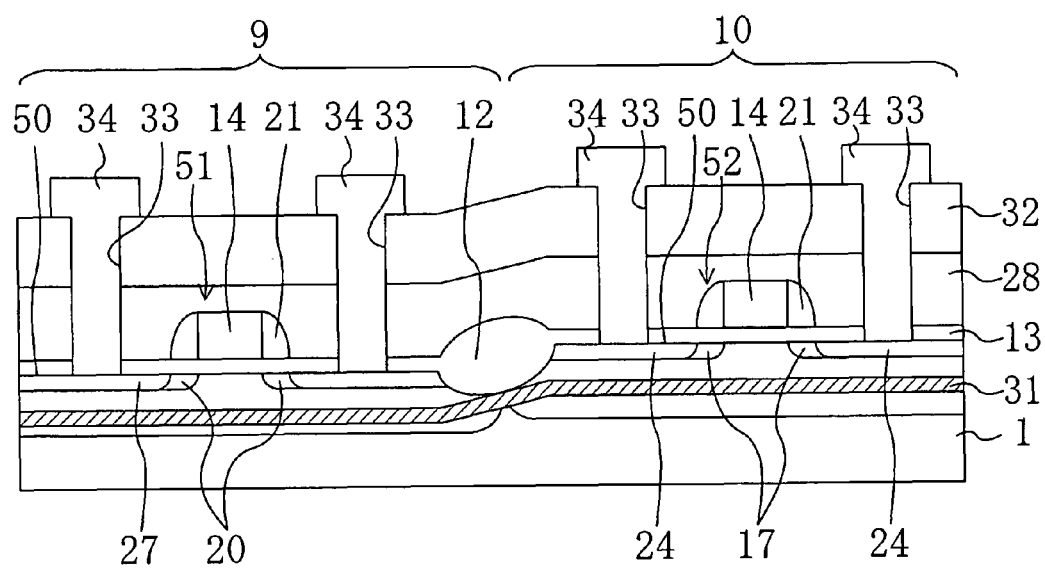
FIG. 20 is a cross-sectional view showing electrodes formed in the electrode formation step.

Thereafter, as shown in FIG. 20, a plurality of contact holes 33 are formed through the gate oxide films 13, the level-difference compensation insulating film 28 and the interlayer insulating film 32. In this case, the contact holes 33 are formed, one at each of locations on top of the P-type high-concentration impurity regions 27 in the N-well region 9 and locations on top of the N-type high-concentration impurity regions 24 in the P-well region 10. Thereafter, the contact holes 33 are filled with a conducting material to form electrodes 34. Each electrode 34 is formed to project beyond the surface of the interlayer insulating film 32. Thus, each electrode 34 is connected to the associated N-type high-concentration impurity region 24 or P-type high-concentration impurity region 27.

Figure 21:
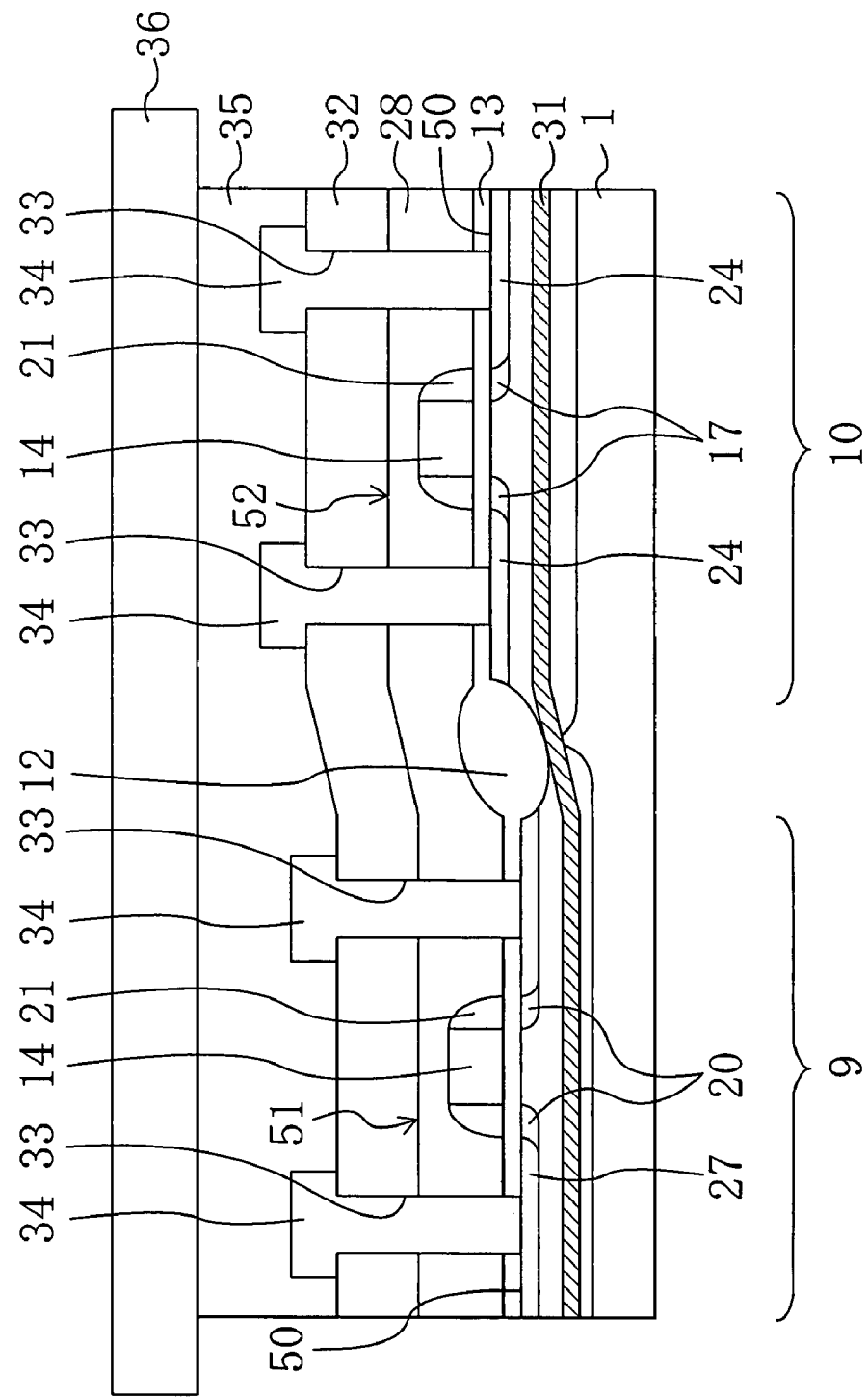
FIG. 21 is a cross-sectional view showing a planarizing film formed in planarizing film formation step and a glass substrate attached in an attachment step.

Next, in a planarizing film formation step, as shown in FIG. 21, a planarizing film 35 is formed to cover the level-difference compensation insulating film 28. Specifically, an insulating film, such as $SiO_2$, is formed on the interlayer insulating film 32 and then planarized by CMP or other planarization techniques. Subsequently, in an attachment step, the surface of the planarizing film 35 is rinsed and a glass substrate 36 is attached onto the surface of the planarizing film 35. The attachment step is performed prior to a separation step.

Figure 22:
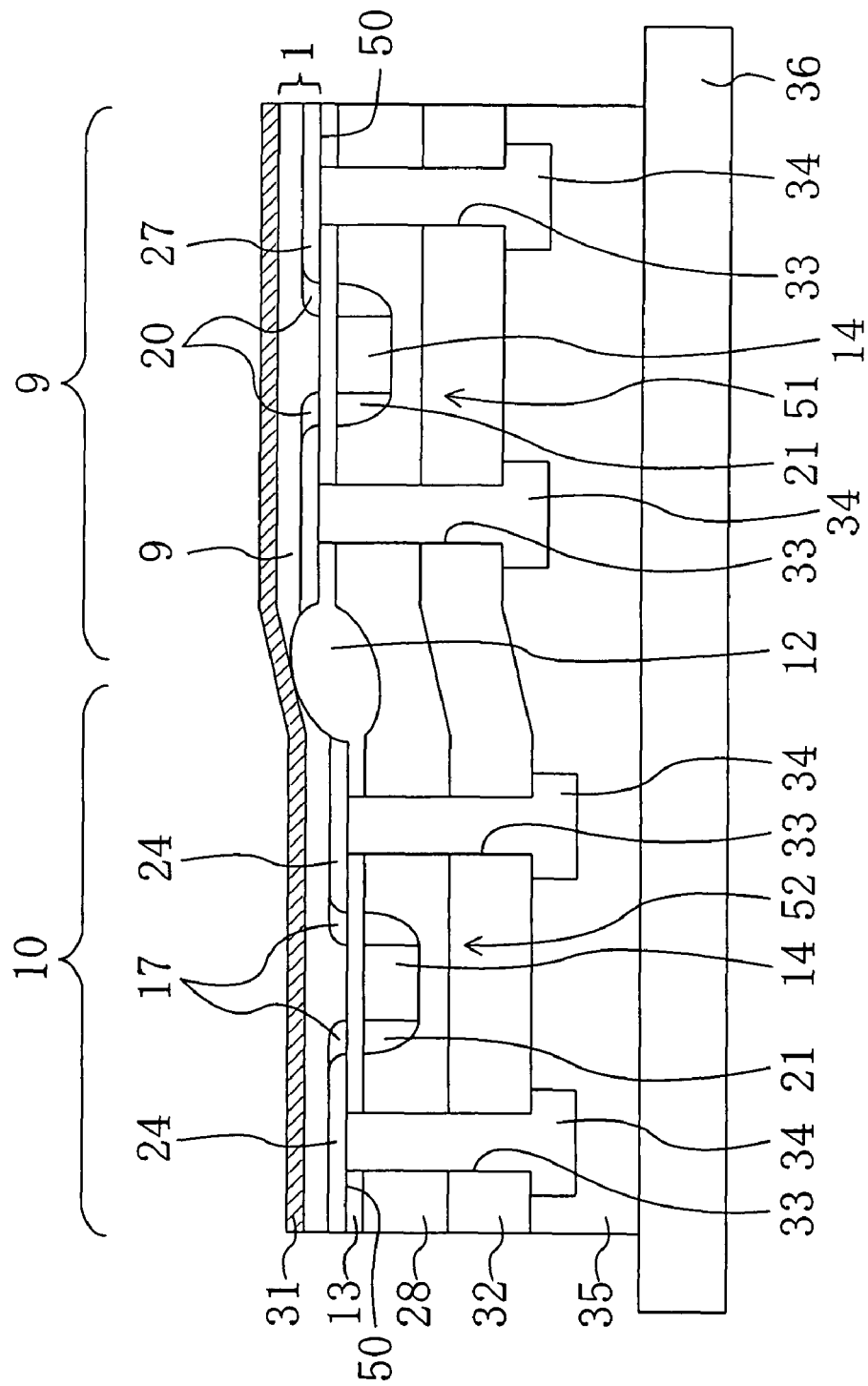
FIG. 22 is a cross-sectional view showing a semiconductor layer partly separated off along the release layer in a separation step.

In the separation step performed next, as shown in an upside-down manner in FIG. 22, the layer stack is thermally treated at about 400° C. to about 600° C. to separate part of the semiconductor substrate 1 off along the release layer 31. As a result, the PMOS transistor 51 and the NMOS transistor 52 are reduced in thickness and overlaid not on the semiconductor substrate 1 but on the glass substrate 36. At this time, since the release layer 31 is formed to have different levels along the element forming surfaces 50, the remaining semiconductor layer 1 (i.e., the rest of the semiconductor substrate 1) is formed with a fixed thickness.

Thereafter, the release layer 31 is removed by etching or other removal techniques and a protective film 37 is formed on the semiconductor layer 1 in order to protect the exposed surface of the semiconductor layer 1 and provide electrical insulation. In this case, following the etching of the release layer 31, the semiconductor layer 1 may be etched until exposure of the LOCOS oxide film 12 to provide element isolation. In the manner described so far, a semiconductor device S is fabricated.

Effects of Embodiment 1

According to Embodiment 1, the PMOS transistor 51 and the NMOS transistor 52 can be fabricated with a reduced thickness on the glass substrate 36 that is a substrate different from the semiconductor substrate 1. Furthermore, since wells for the PMOS transistor 51 and the NMOS transistor 52 can be formed in a single photolithography process, the production time can be shortened and the production cost can be saved. Furthermore, since the substrate surface through which ion implantation is made is formed into a relatively gently shelving surface by covering the gate electrodes 14 and other transistor parts with the level-difference compensation insulating film 28, the release layer 31 can be prevented from being formed to have steep steps.

In addition, since the surface of the level-difference compensation insulating film 28 is formed to have different levels along the element forming surfaces 50, the release layer 31 can be formed, by ion implantation, at a fixed depth from the surface of the level-difference compensation insulating film 28 and the element forming surfaces 50. Therefore, as shown in FIG. 1, the semiconductor layer 1 left after separation can be formed with a fixed thickness c. As a result, the electrical properties of the PMOS transistor 51 and NMOS transistor 52 thus formed can be uniformized and the thickness of the semiconductor layer 1 in each of the PMOS transistor 51 and the NMOS transistor 52 can be appropriately controlled.

Embodiment 2

Figure 23:
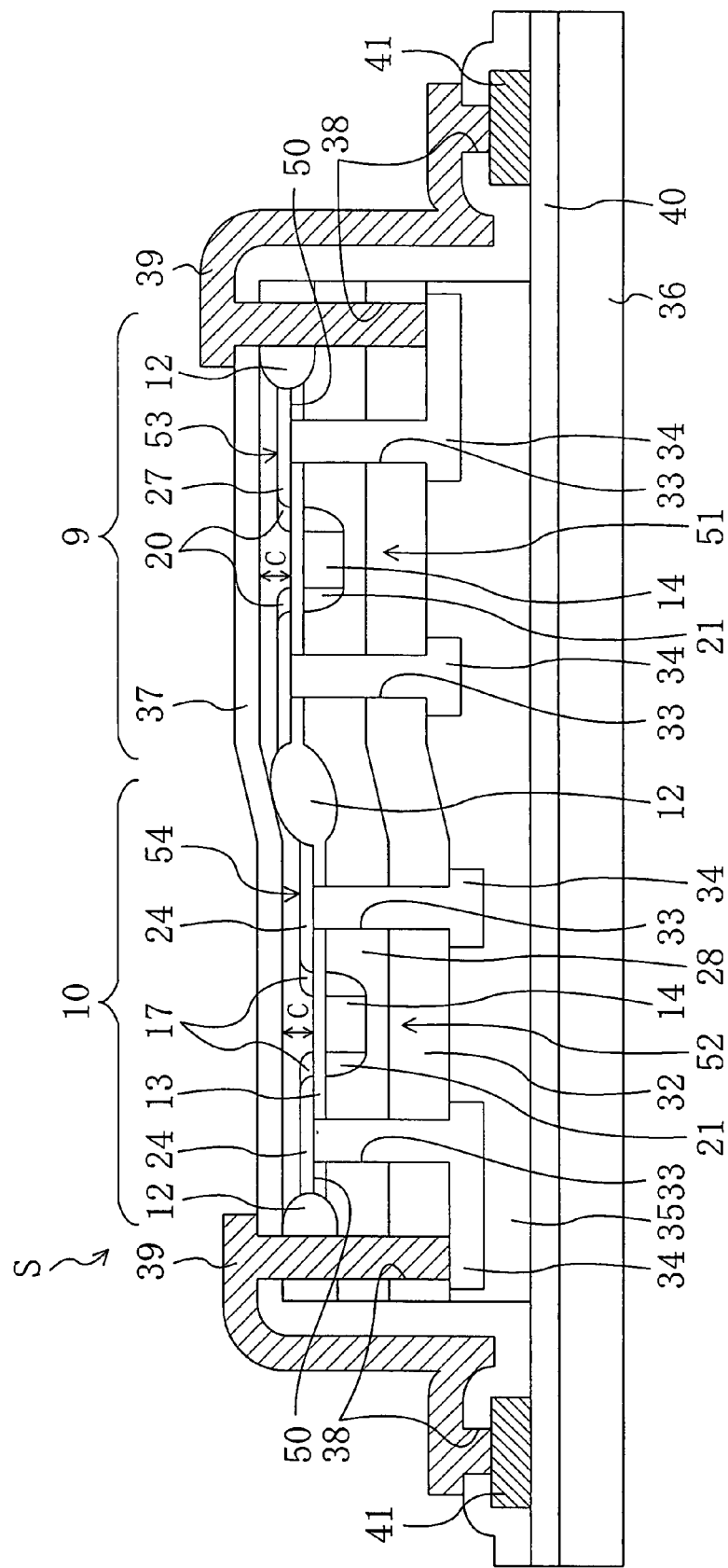
FIG. 23 is a cross-sectional view showing a semiconductor device according to Embodiment 2.
Figure 24:
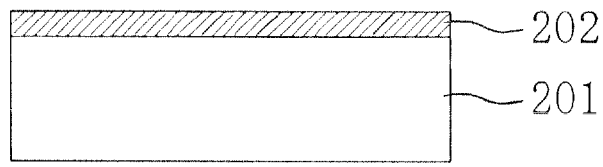
FIG. 24 is a diagram showing a state in which a silicon dioxide layer is formed in a conventional fabrication process of an SOI substrate.
Figure 25:
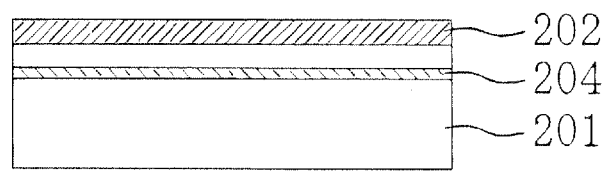
FIG. 25 is a diagram showing a state in which a hydrogen implanted layer is formed in the conventional fabrication process of an SOI substrate.
Figure 26:
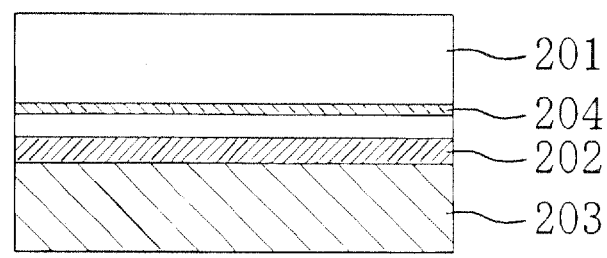
FIG. 26 is a diagram showing a state in which a layer stack is attached onto a glass substrate in the conventional fabrication process of an SOI substrate.
Figure 27:
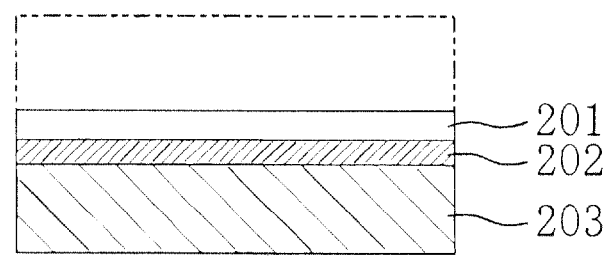
FIG. 27 is a diagram showing a state in which a silicon layer is partly separated off in the conventional fabrication process of an SOI substrate.
Figure 28:
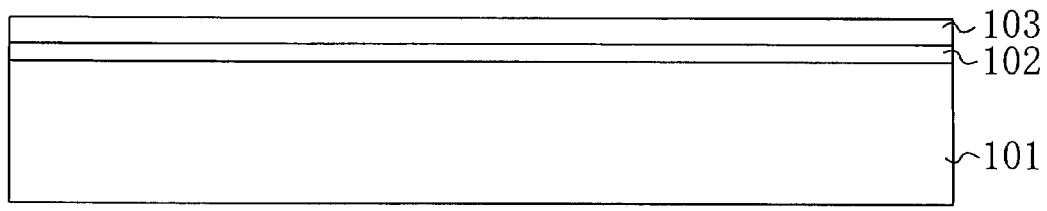
FIG. 28 is a cross-sectional view showing a thermally oxidized film and a silicon nitride film formed on a silicon substrate.
Figure 29:
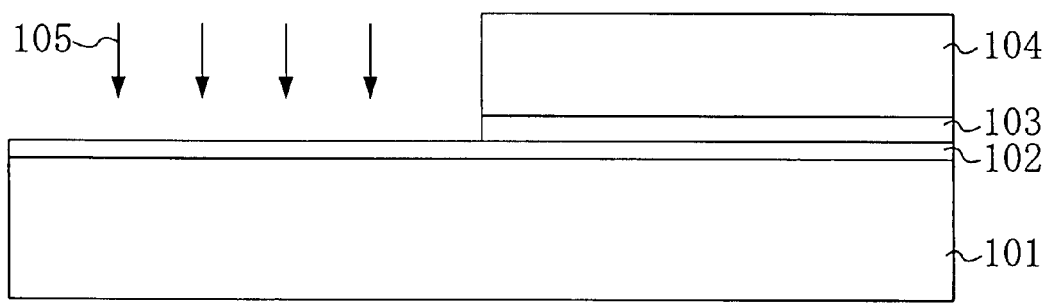
FIG. 29 is a cross-sectional view showing the silicon substrate into which an N-type impurity element is implanted.
Figure 30:
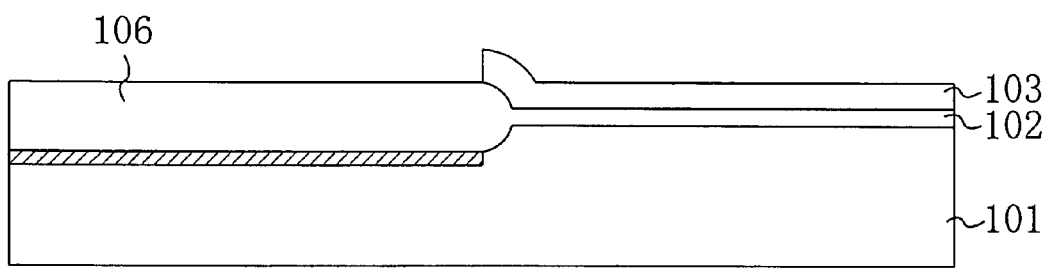
FIG. 30 is a cross-sectional view showing an oxide film formed on the silicon substrate.
Figure 31:
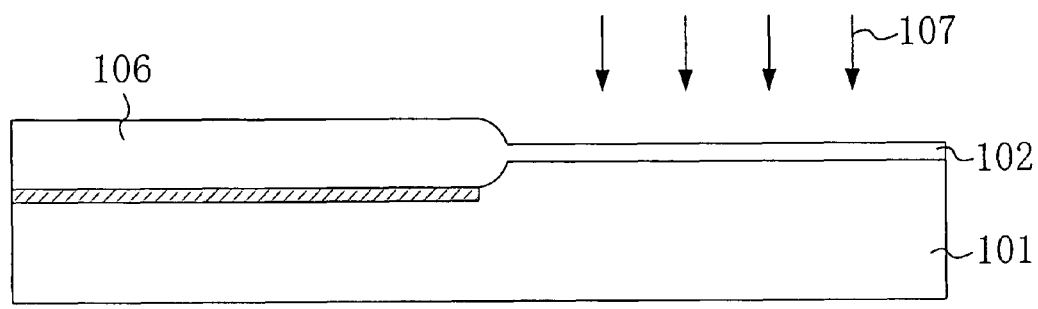
FIG. 31 is a cross-sectional view showing the silicon substrate into which a P-type impurity element is implanted.
Figure 32:
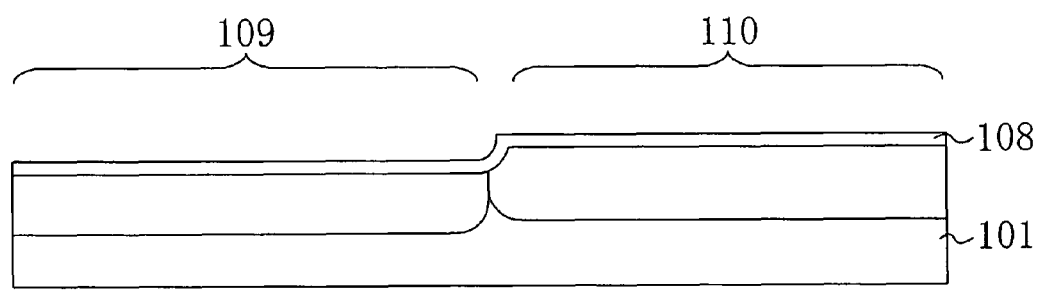
FIG. 32 is a cross-sectional view showing the substrate surface formed to have different levels.
Figure 33:
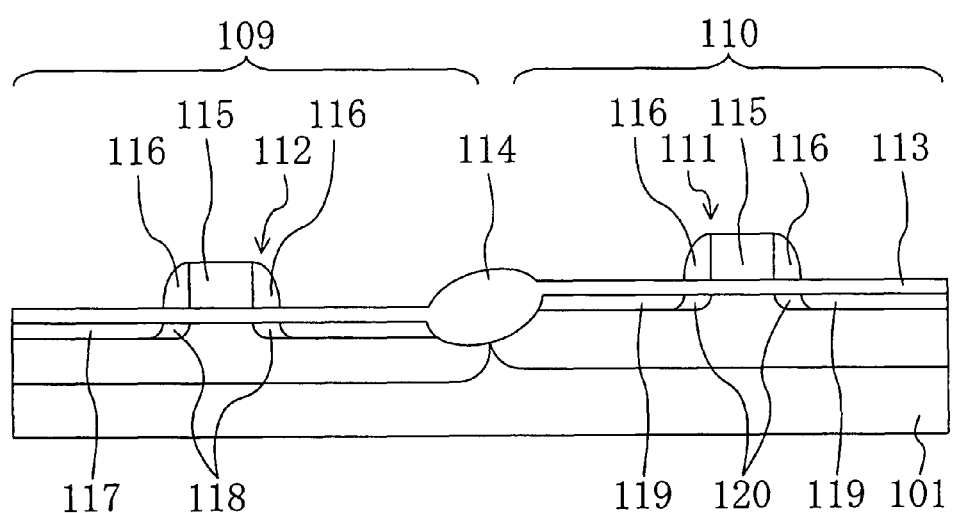
FIG. 33 is a cross-sectional view showing transistors formed on the substrate surface.
Figure 34:
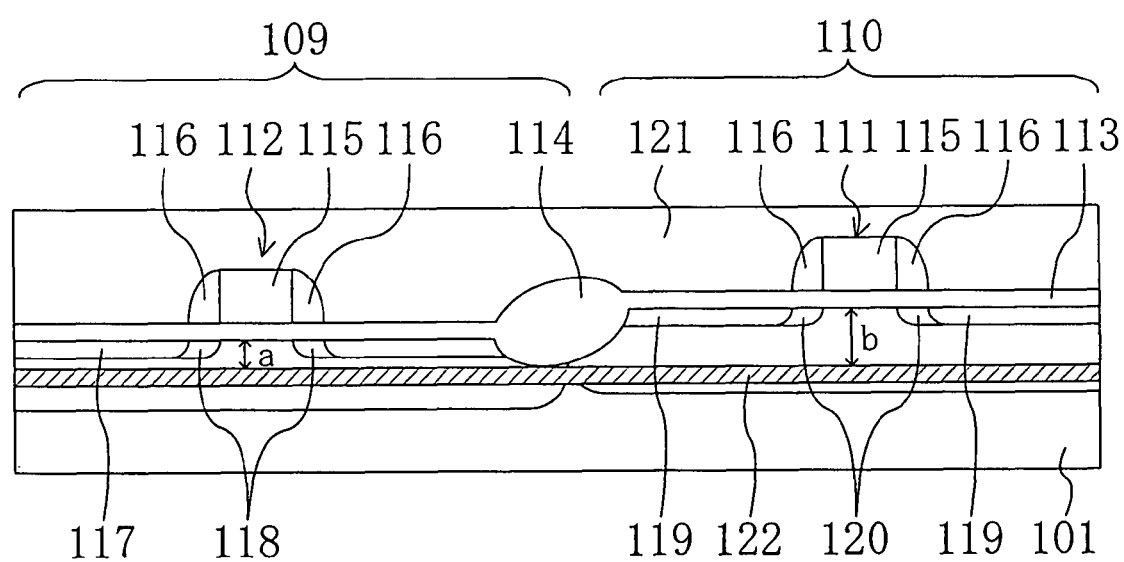
FIG. 34 is a cross-sectional view showing a release layer formed in the silicon substrate.

FIG. 23 shows a semiconductor device and its fabrication method according to Embodiment 2. In the following embodiment, the same parts as in FIGS. 1 to 22 are designated by the same reference characters and a detailed description thereof is not given.

In a semiconductor device S according to this embodiment, a planarizing film 35 is disposed over a glass substrate 36 with an insulating film 40 therebetween. Furthermore, prior to an attachment step, electrical elements 41, such as active elements or passive elements, are formed above the glass substrate 36. The electrical elements 41 are covered with the same film as a protective film 37 covering a semiconductor layer 1. Contact holes 38 are formed in the protective film 37 on top of the electrical elements 41. Contact holes 38 are also formed through an interlayer insulating film 32, a level-difference compensation insulating film 28 and the protective film 37 on top of one of electrodes 34 of a PMOS transistor 51 and one of electrodes 34 of an NMOS transistor 52. Each electrical element 41 is electrically connected to the associated electrode 34 via an associated metal wiring line 39 filled in the associated contact holes 38. Note that in this embodiment LOCOS oxide films 12 are formed, one on each of the right and left sides of the PMOS transistor 51 and the NMOS transistor 52.

In fabricating the semiconductor device S, previously, the insulating film 40 is deposited on the glass substrate 36 and the electrical elements 41 are formed on the glass substrate 36. Then, In the attachment step in Embodiment 1, the surface of the planarizing film 35 formed in the planarizing film formation step is attached onto the insulating film 40 deposited on the glass substrate 36.

Subsequently, like Embodiment 1, the separation step is performed. Thus, the PMOS transistor 51 and the NMOS transistor 52 are overlaid on the glass substrate 36. Thereafter, the protective film 37 is formed to cover the semiconductor layer 1 and the electrical elements 41. During the time, the planarizing film 35, the side surfaces of the interlayer insulating film 32 and the level-difference compensation insulating film 28 are also covered with the protective film 37.

In a wiring formation step performed next, contact holes 38 are formed, one on each top of the electric elements 41 and the electrodes 34. The contact holes 38 are filled with a conducting material. Then, the conducting material is patterned, whereby metal wiring lines 39 are formed to connect the electrical elements 41 to the associated electrodes 34. According to the above steps, a semiconductor device S is fabricated.

Other Embodiment

Although in the above embodiments the level-difference compensation insulating film 28, the interlayer insulating film 32 and the planarizing film 35 are formed in this order, the formation order of these films in the present invention is not limited to this. For example, the level-difference compensation insulating film 28 may be formed with a larger thickness and the planarizing film 35 may be then deposited directly on the level-difference compensation insulating film 28. Thus, the fabrication process can be simplified, thereby providing reduced production cost.

As described so far, the example embodiment presented herein is useful for a method for fabricating a semiconductor device and a semiconductor device and particularly suitable for the case where a plurality of element forming surfaces with different heights are formed on a semiconductor layer in which a release layer is formed, semiconductor elements are formed one on each element forming surface and associated portions of the semiconductor layer in the semiconductor elements are formed with the same thickness.

The invention claimed is:

1. A method for fabricating a semiconductor device comprising:

element forming surface formation for forming a plurality of element forming surfaces of different heights on a semiconductor layer to have different levels;

semiconductor element formation for forming a plurality of semiconductor elements, one in each of a corresponding number of regions of the semiconductor layer, each region including an associated one of the plurality of element forming surfaces;

level-difference compensation insulating film formation for forming a level-difference compensation insulating film on the semiconductor layer to cover the semiconductor elements and have a surface opposite to said semiconductor elements with different levels along the element forming surfaces, said surface being parallel to said element forming surfaces;

release layer formation for forming a release layer in the semiconductor layer by ion-implanting a peeling material through the level-difference compensation insulating film into the semiconductor layer; and separation for separating part of the semiconductor layer along the release layer.

2. The method for fabricating a semiconductor device of claim 1, wherein the level-difference compensation insulating film formation comprises: insulating film deposition for depositing an insulating film having a flat surface onto the semiconductor layer to cover the semiconductor elements; and shaping for shaping the surface of the insulating film to have different levels along the element forming surfaces.

3. The method for fabricating a semiconductor device of claim 1, further comprising:
   planarizing film formation for forming a planarizing film to cover the level-difference compensation insulating film; and
   attachment for attaching a substrate onto the surface of the planarizing film.

4. The method for fabricating a semiconductor device of claim 1, wherein the element forming surface formation comprises forming the element forming surfaces to have different levels by forming a selective oxide film on the semiconductor layer using a mask layer formed by photolithography.

5. The method for fabricating a semiconductor device of claim 1, wherein the semiconductor layer is a silicon layer.

6. The method for fabricating a semiconductor device of claim 1, wherein the peeling material is composed of at least one of hydrogen and inert gas.

7. The method for fabricating a semiconductor device of claim 1, wherein the semiconductor elements are MOS transistors.

8. The method for fabricating a semiconductor device of claim 2, wherein the shaping comprises shaping the surface of the insulating film by etching.

9. The method for fabricating a semiconductor device of claim 3, wherein the attachment is performed prior to the separation.

10. A semiconductor device comprising:
    a semiconductor layer having a plurality of element forming surfaces of different heights formed to have different levels;
    a plurality of semiconductor elements formed one in each of a corresponding number of regions of the semiconductor layer, each region including an associated one of the element forming surfaces; and
    a level-difference compensation insulating film formed on the semiconductor layer to cover the semiconductor elements and have a surface opposite to said semiconductor elements with different levels along the element forming surfaces, said surface being parallel to said element forming surfaces,
    part of the semiconductor layer being separated along a release layer formed by ion-implanting a peeling material into the semiconductor layer, the semiconductor device further comprising:
    a planarizing film covering the level-difference compensation insulating film; and
    a substrate attached onto the surface of the planarizing film.

11. The semiconductor device of claim 10, wherein the substrate is a glass substrate.

12. The semiconductor device of claim 10, wherein the semiconductor layer is a silicon layer.

13. The semiconductor device of claim 10, wherein the peeling material is composed of at least one of hydrogen and inert gas.

14. The semiconductor device of claim 10, wherein the semiconductor elements are MOS transistors.

15. A semiconductor device comprising:
    a semiconductor layer having a plurality of element forming surfaces of different heights formed to have different levels;
    a plurality of semiconductor elements formed one in each of a corresponding number of regions of the semiconductor layer, each region including an associated one of the element forming surfaces; and
    a level-difference compensation insulating film formed on the semiconductor layer to cover the semiconductor elements and have a surface opposite to said semiconductor elements with different levels along the element forming surfaces, said surface being parallel to said element forming surfaces,
    the semiconductor layer being formed with a fixed thickness, the semiconductor device further comprising:
    a planarizing film covering the level-difference compensation insulating film; and
    a substrate attached onto the surface of the planarizing film.

* * * * *